(12) United States Patent
Chiu

(10) Patent No.: US 8,263,447 B2
(45) Date of Patent: Sep. 11, 2012

(54) PIXEL STRUCTURE AND MANUFACTURING METHOD THEREOF AND DISPLAY PANEL

(75) Inventor: Hsien-Kun Chiu, Taoyuan County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 378 days.

(21) Appl. No.: 12/549,370

(22) Filed: Aug. 28, 2009

(65) Prior Publication Data

US 2010/0314634 A1   Dec. 16, 2010

(30) Foreign Application Priority Data

Jun. 15, 2009   (TW) ................................ 98119926 A

(51) Int. Cl.
   *H01L 21/336* (2006.01)
(52) U.S. Cl. .................. 438/158; 257/E21.415; 257/88
(58) Field of Classification Search .................. 438/149, 438/151; 257/E21.413
   See application file for complete search history.

(56) References Cited

U.S. PATENT DOCUMENTS

| | | | |
|---|---|---|---|
| 6,537,840 B2 | 3/2003 | Tseng | |
| 7,016,007 B2 | 3/2006 | Chang et al. | |
| 2005/0139836 A1* | 6/2005 | Oh | 257/72 |
| 2007/0172998 A1* | 7/2007 | Lee | 438/149 |
| 2007/0254415 A1* | 11/2007 | Oh et al. | 438/149 |

FOREIGN PATENT DOCUMENTS

TW   200735371   9/2007

* cited by examiner

*Primary Examiner* — Zandra Smith
*Assistant Examiner* — Paul Patton
(74) *Attorney, Agent, or Firm* — Jianq Chyun IP Office

(57) ABSTRACT

A pixel structure and a manufacturing method thereof and a display panel are provided. An electrode material layer, a shielding material layer, an inter-layer dielectric material layer, a semiconductor material layer and a photoresist-layer are sequentially formed on a substrate. The semiconductor material layer, the inter-layer dielectric material layer, the shielding material layer and the electrode material layer are patterned using the photoresist-layer as a mask to form a semiconductor pattern, an inter-layer dielectric pattern, a shielding pattern and a pixel electrode. A source/drain electrically connected to the pixel electrode and covering a portion of the semiconductor pattern is formed on the pixel electrode. A channel is another portion of the semiconductor uncovered by the source/drain. A dielectric layer covering the source/drain, the semiconductor pattern, the inter-layer dielectric pattern, the shielding pattern and the pixel electrode and a gate disposed on the dielectric layer above the channel are formed.

7 Claims, 14 Drawing Sheets

PIXEL STRUCTURE AND MANUFACTURING METHOD THEREOF AND DISPLAY PANEL

CROSS-REFERENCE TO RELATED APPLICATION

This application claims the priority benefit of Taiwan application serial no. 98119926, filed on Jun. 15, 2009. The entirety of the above-mentioned patent application is hereby incorporated by reference herein and made a part of specification.

BACKGROUND OF THE INVENTION

1. Field of the Invention

The present invention is related to a pixel structure and a manufacturing method thereof and a display panel, and particularly related to, a manufacturing method of a pixel structure using less masks and a display panel and the pixel structure thereof formed accordingly.

2. Description of Related Art

Generally, a masking process is applied to define each layer of patterns of pixel structures in display panels. However, cost of a mask is quite expensive so that the number of masks becomes one of main reasons impacting on fabrication costs of the manufacturing process.

As consumers continuously pursue large-sized display panels, the manufacturing process of display panels developed towards large-sized fabrication becomes a mainstream of current display technology, thereby making a size of the mask increased accordingly and further increasing costs of the masks.

However, while every manufacturer focuses on research and development of possible technologies for reducing the number of masks, it is also required to maintain display quality of the display panels and component characteristics of every element in pixel structures thereof.

SUMMARY OF THE INVENTION

The present invention provides a manufacturing method of pixel structure, which saves cost and simplifies manufacturing processes by reducing the number of masks.

The present invention also provides a pixel structure in which thin film transistors (TFTs) disposed therein have good electrical characteristics.

The present invention further provides a display panel which has the aforementioned pixel structure, thereby having good display quality.

The present invention provides a manufacturing method of a pixel structure. The manufacturing method includes following steps. First, an electrode material layer, a shielding material layer, an inter-layer dielectric material layer, a semiconductor material layer and a first photoresist-layer are formed sequentially on a substrate. Then, the semiconductor material layer, the inter-layer dielectric material layer, the shielding material layer and the electrode material layer are patterned by using the first photoresist-layer as a mask to form a semiconductor pattern, an inter-layer dielectric pattern, a shielding pattern and a pixel electrode. Next, a source/drain is formed on the pixel electrode, wherein the source/drain is electrically connected to the pixel electrode and covers a portion of the semiconductor pattern, and a channel is another portion of the semiconductor pattern uncovered by the source/drain. Further, a dielectric layer and a gate are formed on the substrate, wherein the dielectric layer covers the source/drain, the semiconductor pattern, the inter-layer dielectric pattern, the shielding pattern and the pixel electrode, and the gate is disposed on the dielectric layer above the channel.

According to an embodiment of the present invention, the first photoresist-layer has a thinner portion and a thicker portion, and a method of forming the semiconductor pattern, the inter-layer dielectric pattern, the shielding pattern and the pixel electrode includes following steps. First, the semiconductor material layer, the inter-layer dielectric material layer, the shielding material layer and the electrode material layer are patterned by using the first photoresist-layer as a mask to form a semiconductor material pattern, an inter-layer dielectric material pattern, a shielding material pattern and the pixel electrode. Next, the thinner portion is removed and the thicker portion is retained. Next, the exposed semiconductor material pattern, the exposed inter-layer dielectric material pattern and the exposed shielding material pattern are removed by using the thicker portion of the first photoresist-layer as the mask to form the semiconductor pattern, the inter-layer dielectric pattern and the shielding pattern. Afterwards, the first photoresist-layer is removed. In an embodiment, the method of forming the first photoresist-layer includes using a half-tone mask or a gray-level mask.

According to an embodiment of the present invention, the manufacturing method of the pixel structure further includes following steps. First, an ohmic contact material layer is formed on the semiconductor material layer. Then, the ohmic contact material layer is patterned by using the first photoresist-layer as the mask to form an ohmic contact material pattern on the semiconductor pattern. Further, the exposed ohmic contact material pattern is removed by using the source/drain as a mask to form an ohmic contact pattern between the semiconductor pattern and the source/drain.

According to an embodiment of the present invention, the dielectric layer completely covers the pixel electrode.

According to an embodiment of the present invention, a method of forming the dielectric layer and the gate includes following steps. First, a dielectric material layer, a conductive material layer and a second photoresist-layer are formed sequentially on the substrate, wherein the second photoresist-layer has a thinner portion and a thicker portion, and the dielectric material layer covers the semiconductor pattern, the inter-layer dielectric pattern, the shielding pattern and the pixel electrode. Then, the conductive material layer and the dielectric material layer are patterned by using the second photoresist-layer as a mask to form a conductive material pattern and the dielectric layer, and exposing a portion of the pixel electrode. Next, the thinner portion is removed and the thicker portion is retained. Further, the exposed conductive material pattern is removed by using the thicker portion of the second photoresist-layer as the mask to form the gate. Afterwards, the second photoresist-layer is removed. In an embodiment, the method of forming the second photoresist-layer includes using a half-tone mask or a gray-level mask.

The present invention also provides a pixel structure, disposed on a substrate, wherein the pixel structure includes a pixel electrode, a shielding pattern, an inter-layer dielectric pattern, a semiconductor pattern, a source/drain, a dielectric layer and a gate. The shielding pattern is disposed on a portion of the pixel electrode, the inter-layer dielectric pattern is disposed on the shielding pattern, and the semiconductor pattern is disposed on the inter-layer dielectric pattern. The source/drain is electrically connected to the pixel electrode and covers a portion of the semiconductor pattern, wherein a channel is another portion of the semiconductor pattern uncovered by the source/drain. The dielectric layer covers the source/drain, the semiconductor pattern, the inter-layer dielectric pattern, the shielding pattern and the pixel electrode, and the gate is disposed on the dielectric layer above the channel.

The present invention further provides a display panel, which includes an active element substrate, an opposite substrate and a display dielectric layer, wherein the display dielectric layer is disposed between the active element substrate and the opposite substrate. The active element substrate includes a substrate and a plurality of pixel structures, a plurality of scan lines and a plurality of data lines disposed on the substrate, wherein each of the pixel structures includes a pixel electrode, a shielding pattern, an inter-layer dielectric pattern, a semiconductor pattern, a source/drain, a dielectric layer and a gate. The shielding pattern is disposed on a portion of the pixel electrode, the inter-layer dielectric pattern is disposed on the shielding pattern, and the semiconductor pattern is disposed on the inter-layer dielectric pattern. The source/drain is electrically connected to the pixel electrode and covers a portion of the semiconductor pattern, wherein a channel is another portion of the semiconductor pattern uncovered by the source/drain. The dielectric layer covers the source/drain, the semiconductor pattern, the inter-layer dielectric pattern, the shielding pattern and the pixel electrode, and the gate is disposed on the dielectric layer above the channel. The scan lines are parallel to each other, wherein each of the scan lines is electrically connected to a corresponding gate. The data lines are parallel to each other, wherein each of the data lines is electrically connected to a source/drain.

According to an embodiment of the present invention, a boundary of the semiconductor pattern does not exceed a boundary of the shielding pattern.

According to an embodiment of the present invention, the shielding pattern, the inter-layer dielectric pattern and the semiconductor pattern substantially have an identical pattern.

According to an embodiment of the present invention, the pixel structure further includes an ohmic contact pattern, wherein the ohmic contact pattern is disposed between the semiconductor pattern and the source/drain.

According to an embodiment of the present invention, the dielectric layer completely covers the pixel electrode.

According to an embodiment of the present invention, the dielectric layer exposes a portion of the pixel electrode.

According to an embodiment of the present invention, the opposite substrate includes a common electrode.

In view of the above, the manufacturing method of a pixel structure of the present invention uses three-mask processes to form the pixel structure of the present invention, which not only saves fabrication cost of the masks but also simplifies complexity of the manufacturing processes. In addition, a phenomenon of photo-induced leakage current of the TFTs due to lighting in the display panel and the pixel structure thereof of the present invention may be improved, thereby possessing electrical characteristics and further making the display panel to have good display quality.

In order to make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 2F is a cross-section diagram according to a cross-section line L2-L2' in FIG. 2F'.

DESCRIPTION OF THE EMBODIMENTS

Figure 1A:
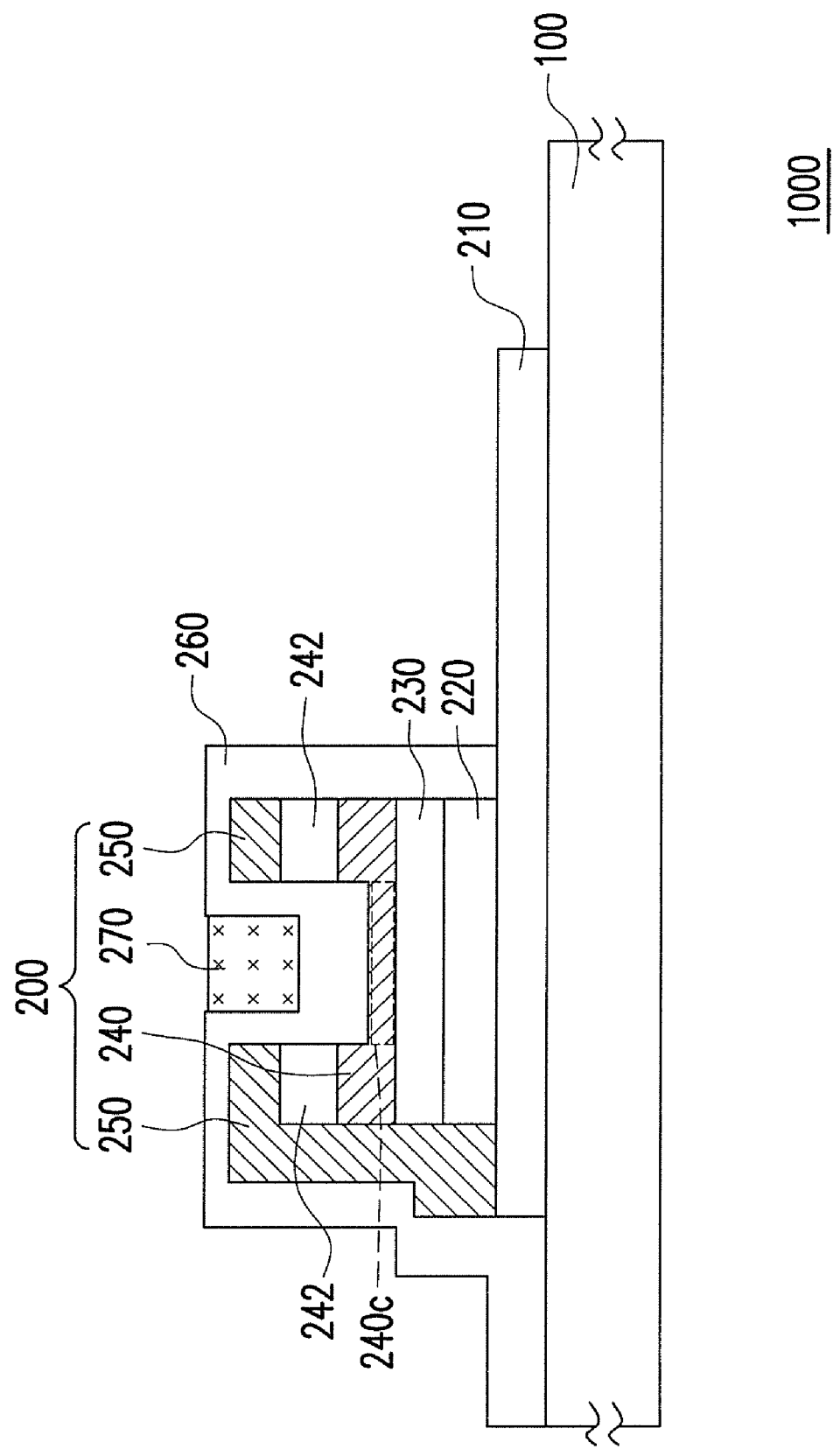
FIG. 1A is a partially cross-section schematic diagram illustrating a pixel structure according to an embodiment of the present invention.
Figure 1B:
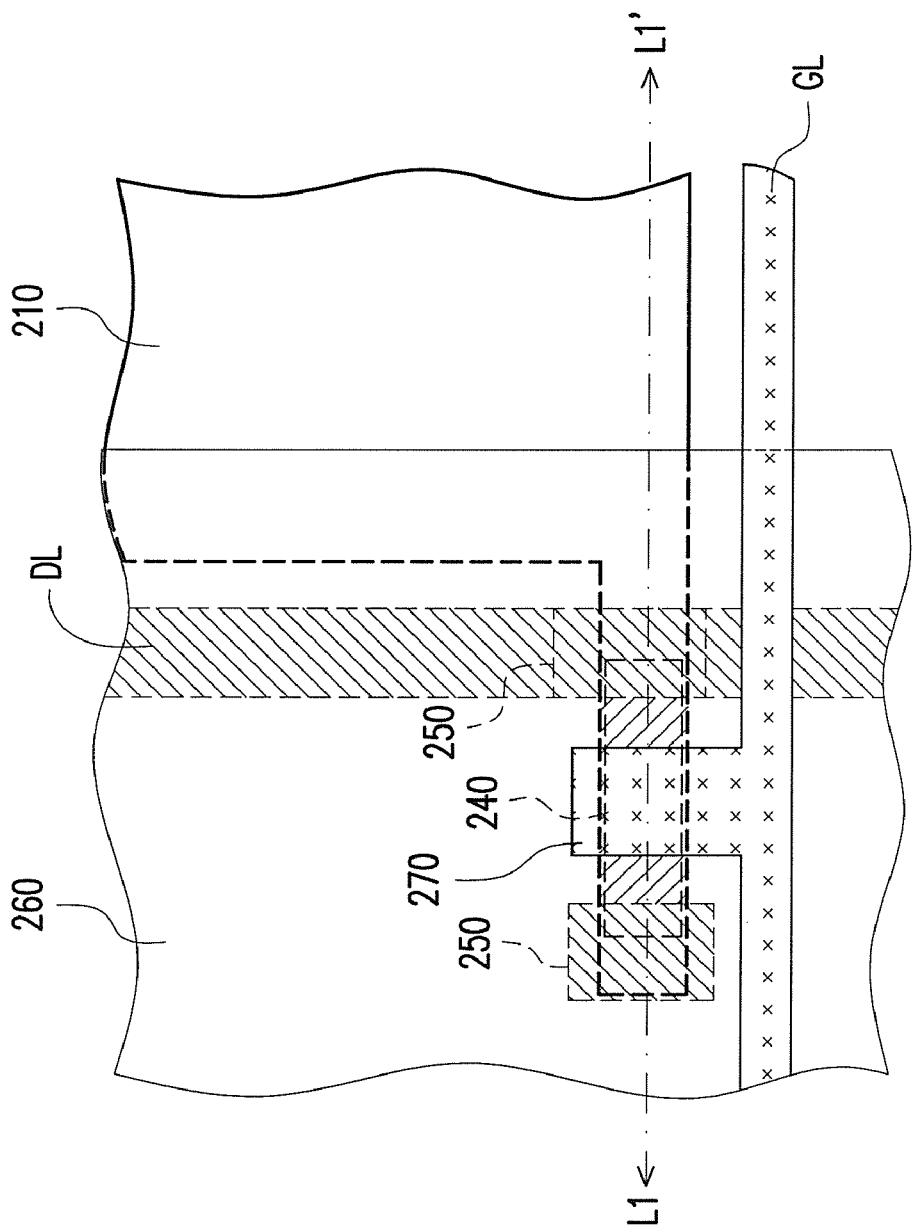
FIG. 1B is a partially top view diagram illustrating the present embodiment having the pixel structure of FIG. 1A.

FIG. 1A is a partially cross-section schematic diagram illustrating a pixel structure according to an embodiment of the present invention. FIG. 1B is a partially top view diagram illustrating the present embodiment having a pixel structure 1000, wherein FIG. 1A is a cross-section diagram according to a cross-section line L1-L1' in FIG. 1B. Referring to both FIG. 1A and FIG. 1B, the pixel structure 1000 of the present embodiment is disposed on a substrate 100, wherein the pixel structure 1000 includes a pixel electrode 210, a shielding pattern 220, an inter-layer dielectric pattern 230, a semiconductor pattern 240, a source/drain 250, a dielectric layer 260 and a gate 270.

Following the preceding paragraph, the shielding pattern 220 is disposed on a portion of the pixel electrode 210, the inter-layer dielectric pattern 230 is disposed on the shielding pattern 220, and the semiconductor pattern 240 is disposed on the inter-layer dielectric pattern 230. The source/drain 250 is electrically connected to the pixel electrode 210 and covers a portion of the semiconductor pattern 240, wherein a channel 240c is another portion of the semiconductor pattern 240 uncovered by the source/drain 250. The dielectric layer 260 covers the source/drain 250, the semiconductor pattern 240, the inter-layer dielectric pattern 230, the shielding pattern 220 and the pixel electrode 210, and the gate 270 is disposed on the dielectric layer 260 above the channel 240c.

In the present embodiment, an ohmic contact pattern 242 is further disposed between the semiconductor pattern 240 and the source/drain 250 in the pixel structure 1000 such that the ohmic contact pattern 242 respectively forms good ohmic contact with the semiconductor pattern 240 and the source/drain 250.

It is to known from FIG. 1A and FIG. 1B, a thin film transistor (TFT) formed by the gate 270, the source/drain 250 and the semiconductor pattern 240 is a top gate TFT 200, wherein the gate 270 is electrically connected to a scan line GL for receiving scan signals, and the source/drain 250 is electrically connected to a data line DL for receiving data signals.

FIG. 2A-FIG. 2I are partially cross-section schematic diagrams illustrating a manufacturing process of a pixel structure according to an embodiment of the present invention. First, referring to FIG. 2A, an electrode material layer 210a, a shielding material layer 220a, an inter-layer dielectric material layer 230a, a semiconductor material layer 240a and a first photoresist-layer PR1 are formed sequentially on a substrate 100. In the present embodiment, materials of the substrate 100 are transparent materials such as glass, quartz, or plastic. The electrode material layer 210a is, for example, an Indium Tin Oxide (ITO). The shielding material layer 220a is, for example, an opaque metal material, and the inter-layer dielectric material layer 230a is, for example, SiN$_x$. However, for the ohmic contact pattern 242 to be formed in the pixel structure 1000 of FIG. 1A, an ohmic contact material layer 242a may be formed on the semiconductor material layer 240a before a step of forming a first photoresist-layer PR1 of FIG. 2A, wherein materials of the semiconductor material layer 240a and the ohmic contact material layer 242a are respectively, for example, amorphous silicon and N-type heavily doped amorphous silicon.

Following the preceding paragraph, the first photoresist-layer PR1 of the present embodiment has a thinner portion PR11 and a thicker portion PR12, wherein the first photoresist-layer PR1 is, for example, a positive photoresist. Besides, a method of forming the first photoresist-layer PR1 is, for example, firstly coating a photosensitive material layer (not shown) on the semiconductor material layer 240a by a spin coating, a slit/spin coating or a spin-less coating. Then, after the photosensitive material layer is exposed by using a half-tone mask (HTM) M or a gray-level mask M with zones of different light penetration rates, processes such as development and hard bake are further performed. Wherein, the half-tone mask M or the gray-level mask M includes a transparent zone $M_{100}$ with a substantially 100% light penetration rate, a half-transparent zone $M_x$ corresponding to a thinner portion PR11 and an opaque zone $M_0$ with a substantially 0% light penetration rate and corresponding to a thicker portion PR12.

Figure 2A:
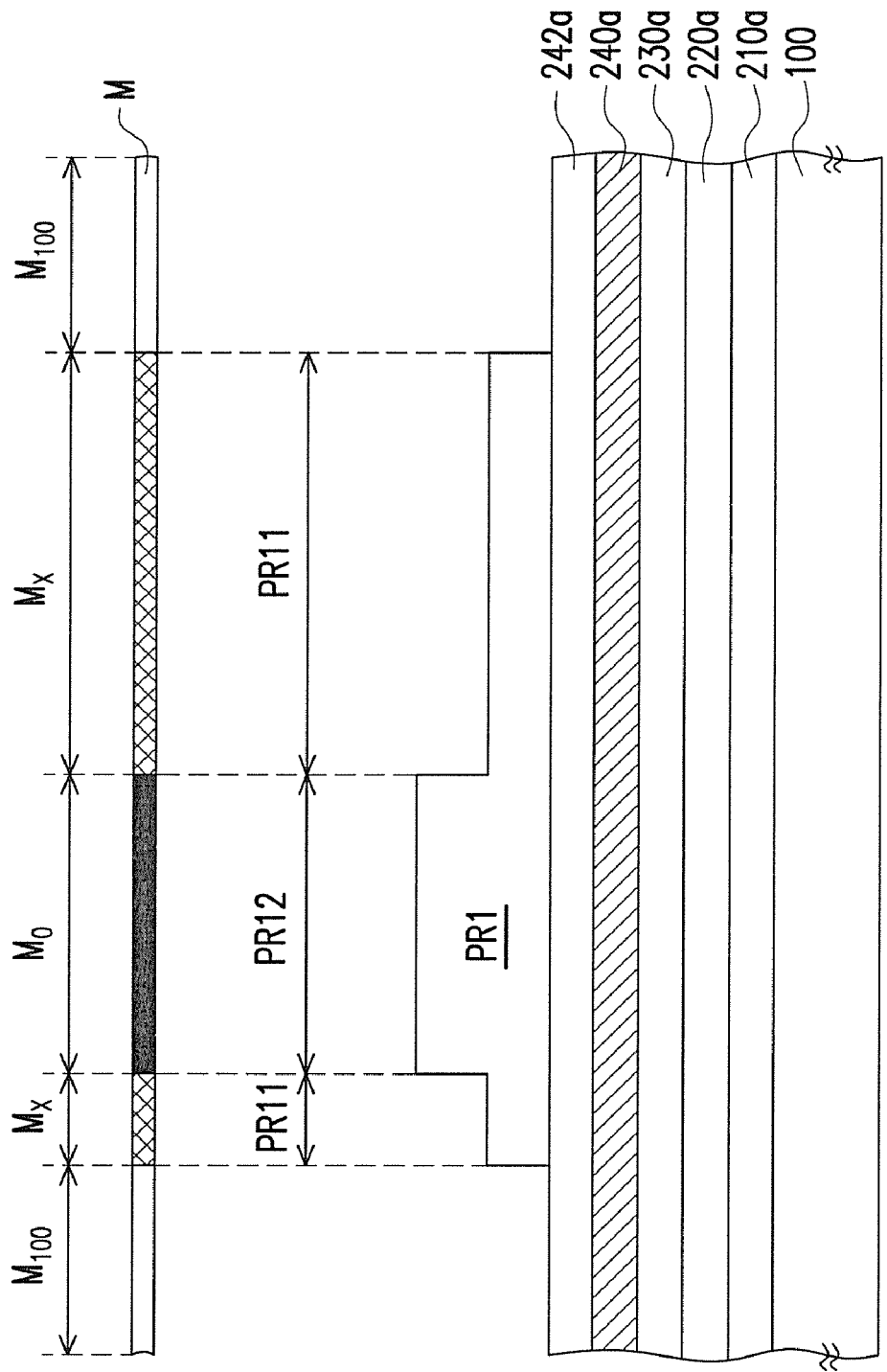
FIG. 2A-FIG. 2I are partially cross-section schematic diagrams illustrating a manufacturing process of a pixel structure according to an embodiment of the present invention.
Figure 2B:
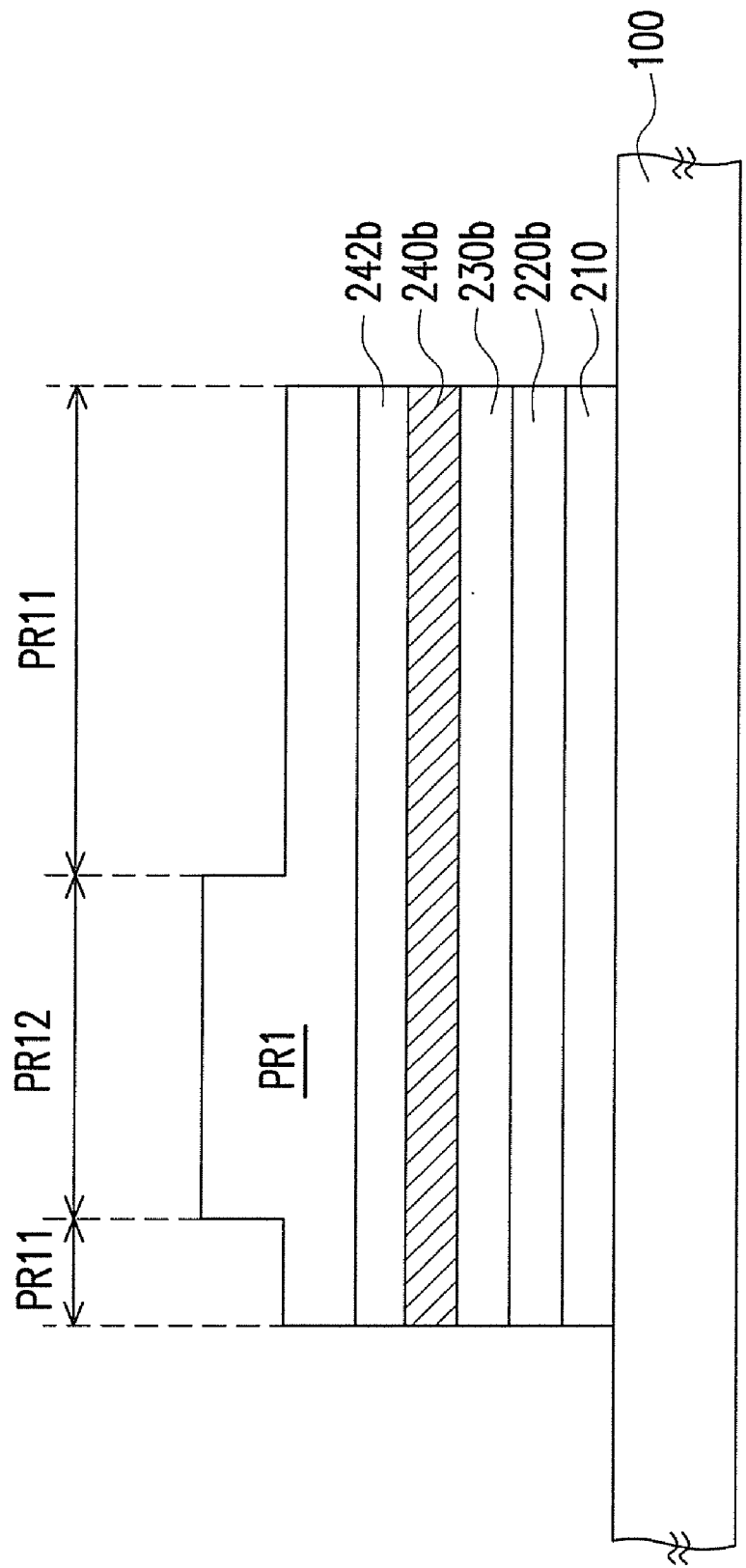

Then, referring to FIG. 2B, the ohmic contact material layer 242a, the semiconductor material layer 240a, the inter-layer dielectric material layer 230a, the shielding material layer 220a and the electrode material layer 210a are patterned by using the first photoresist-layer PR1 as the mask to form an ohmic contact material pattern 242b, a semiconductor material pattern 240b, an inter-layer dielectric material pattern 230b, a shielding material pattern 220b and the pixel electrode 210.

Figure 2C:
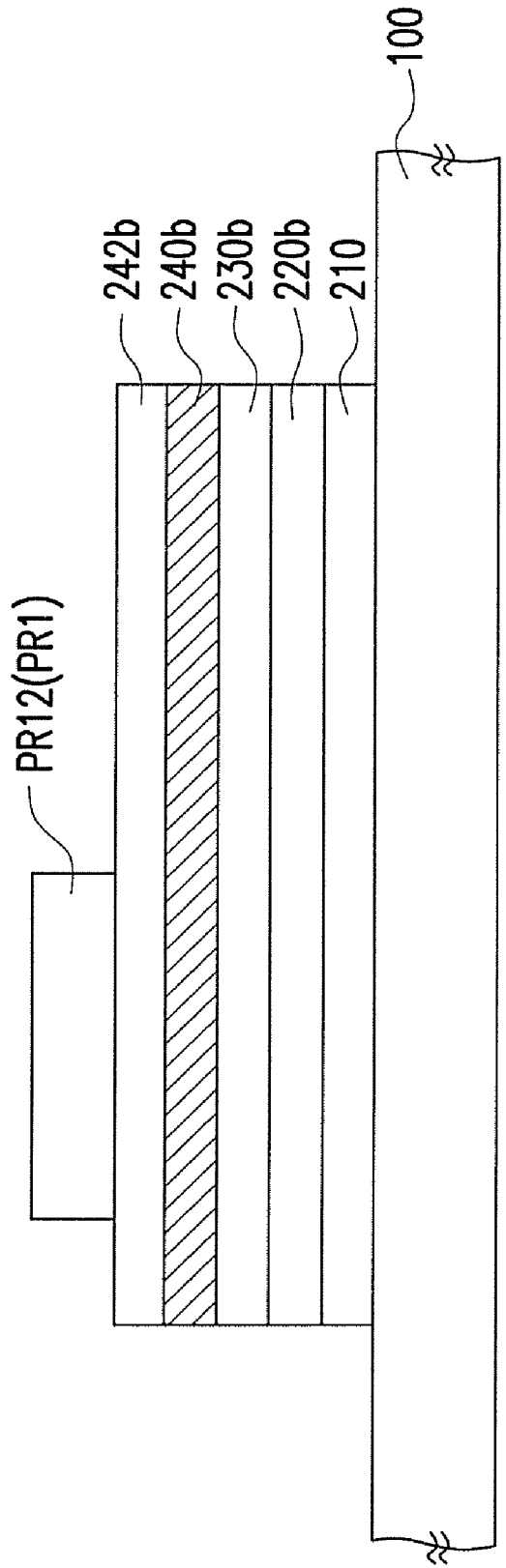

Next, a thickness of the first photoresist-layer PR1 is reduced until a thinner portion PR11 of the first photoresist-layer PR1 is removed but the thicker portion PR12 thereof is retained, as illustrated in FIG. 2C. In the present embodiment, a method of reducing the thickness of the first photoresist-layer PR1 is, for example, to perform a dry etching ashing process.

Figure 2D:
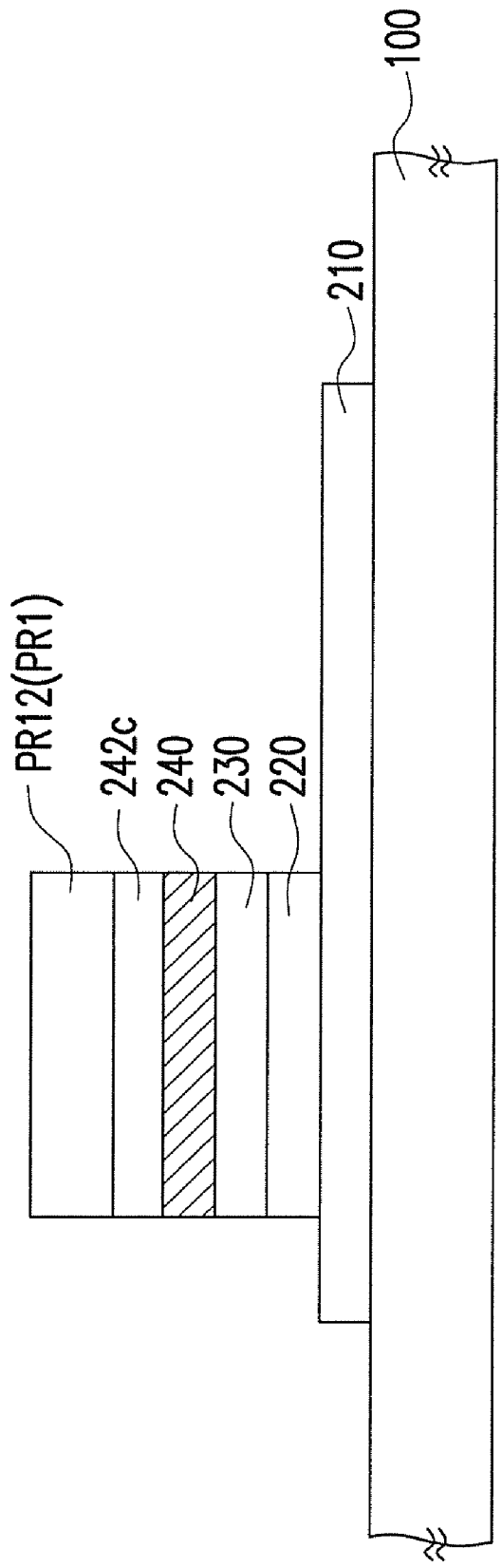

Then, the exposed ohmic contact material pattern 242b, the exposed semiconductor material pattern 240b, the exposed inter-layer dielectric material pattern 230b and the exposed shielding material pattern 220b are removed by using the thicker portion PR12 of the first photoresist-layer PR1 as the mask to from the ohmic contact material pattern 242c, the semiconductor pattern 240, the inter-layer dielectric pattern 230 and the shielding pattern 220 as illustrated in FIG. 2D.

According to the preceding paragraphs, it is known that the present embodiment uses a method by one-mask process to form the semiconductor pattern 240, the inter-layer dielectric pattern 230, the shielding pattern 220 and the pixel electrode 210 in the pixel structure 1000 (illustrated in FIG. 1A). Subsequently, the first photoresist-layer PR1 is removed as illustrated in FIG. 2E.

The method of forming the source/drain 250 (illustrated in FIG. 1A) is described thereafter. Referring to both FIG. 2F and FIG. 2F', wherein FIG. 2F is a cross-section diagram according to a cross-section line L2-L2' in FIG. 2F'. The source/drain 250 is formed on the pixel electrode 210, wherein the source/drain 250 is electrically connected to the pixel electrode 210 and covers a portion of the semiconductor pattern 240, and the channel 240c is another portion of the semiconductor pattern 240 uncovered by the source/drain 250.

In the present embodiment, the source/drain 250 is formed by using another one mask process. More specifically, a first conductive material layer (not shown) is first formed on the substrate 100, wherein the first conductive material layer is formed by, for example, a sputtering, an evaporation or other thin film deposition technologies, and the first conductive material layer is patterned thereafter by an etching process to form the source/drain 250.

Figure 2E:
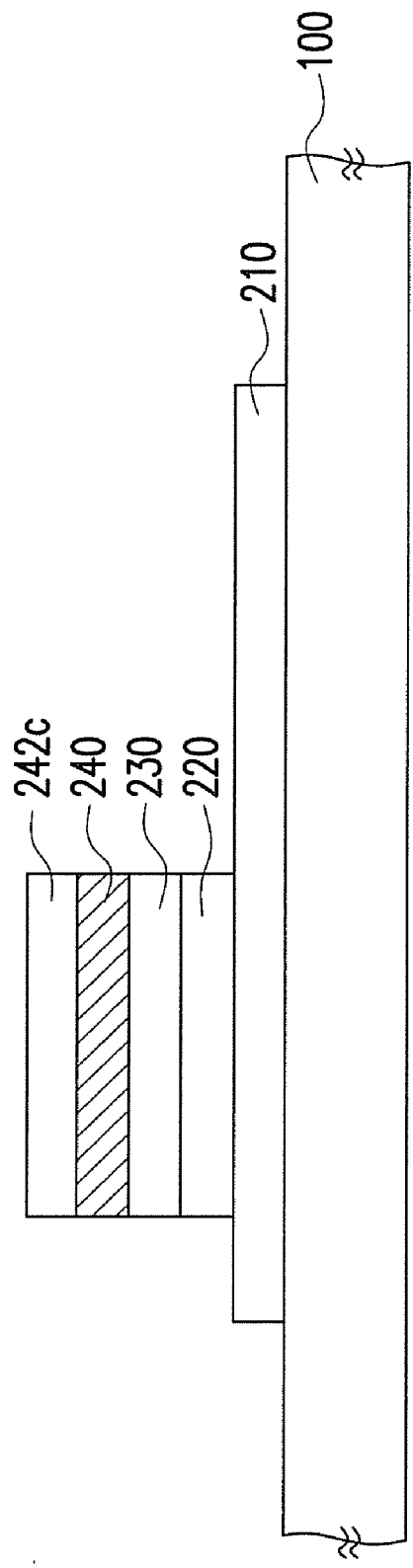
Figure 2F:
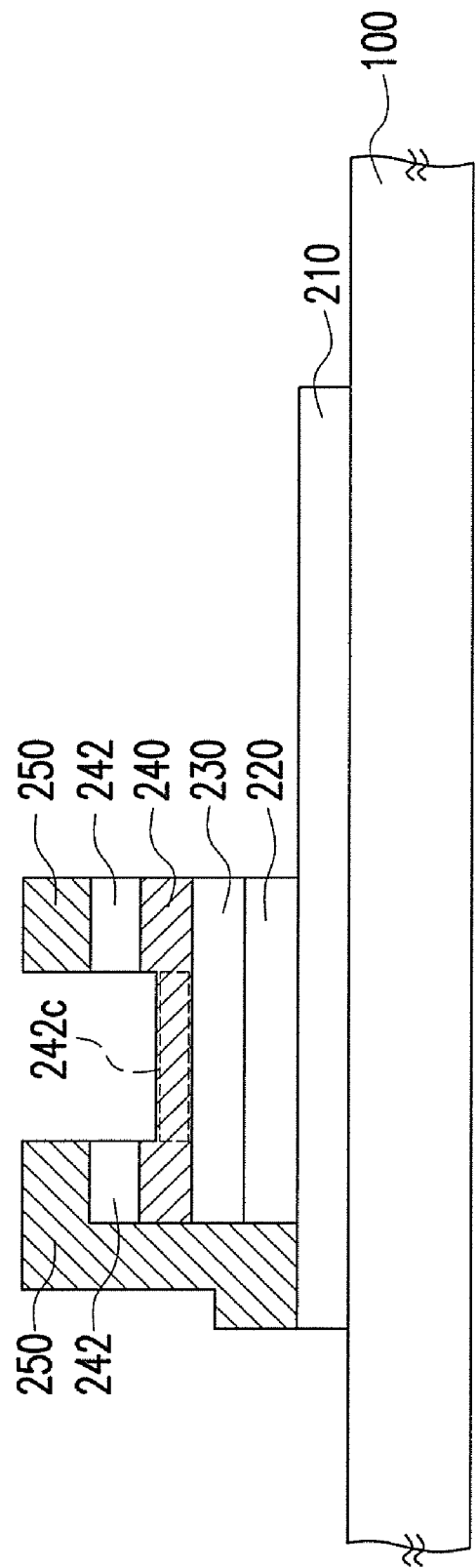
Figure 2F:
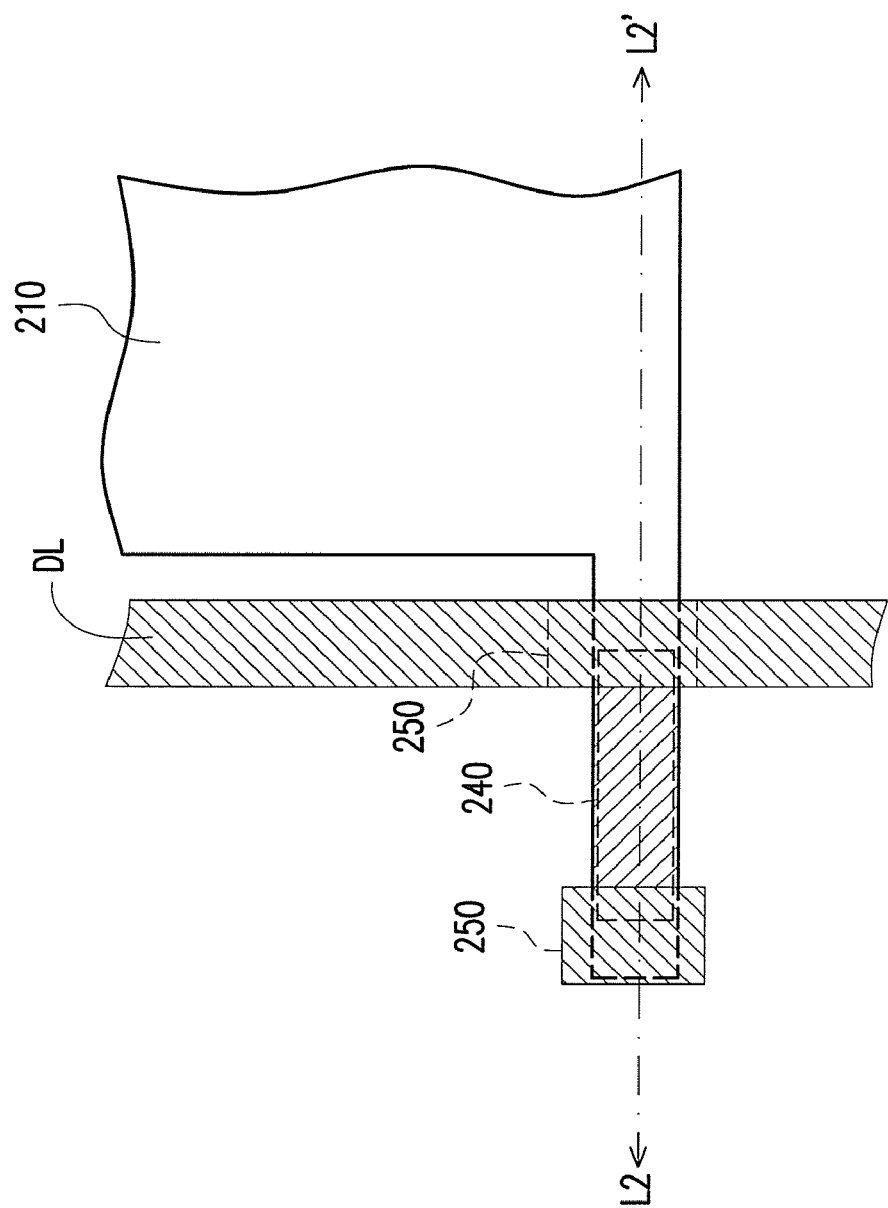

It is to be noted that, in the foregoing process, the present embodiment may further removes the exposed ohmic contact material pattern 242c illustrated in FIG. 2E by using the source/drain 250 as the mask and through a dry etching process so as to from an ohmic contact pattern 242 between the semiconductor pattern 240 and the source/drain 250 as illustrated in FIG. 2F.

Figure 2G:
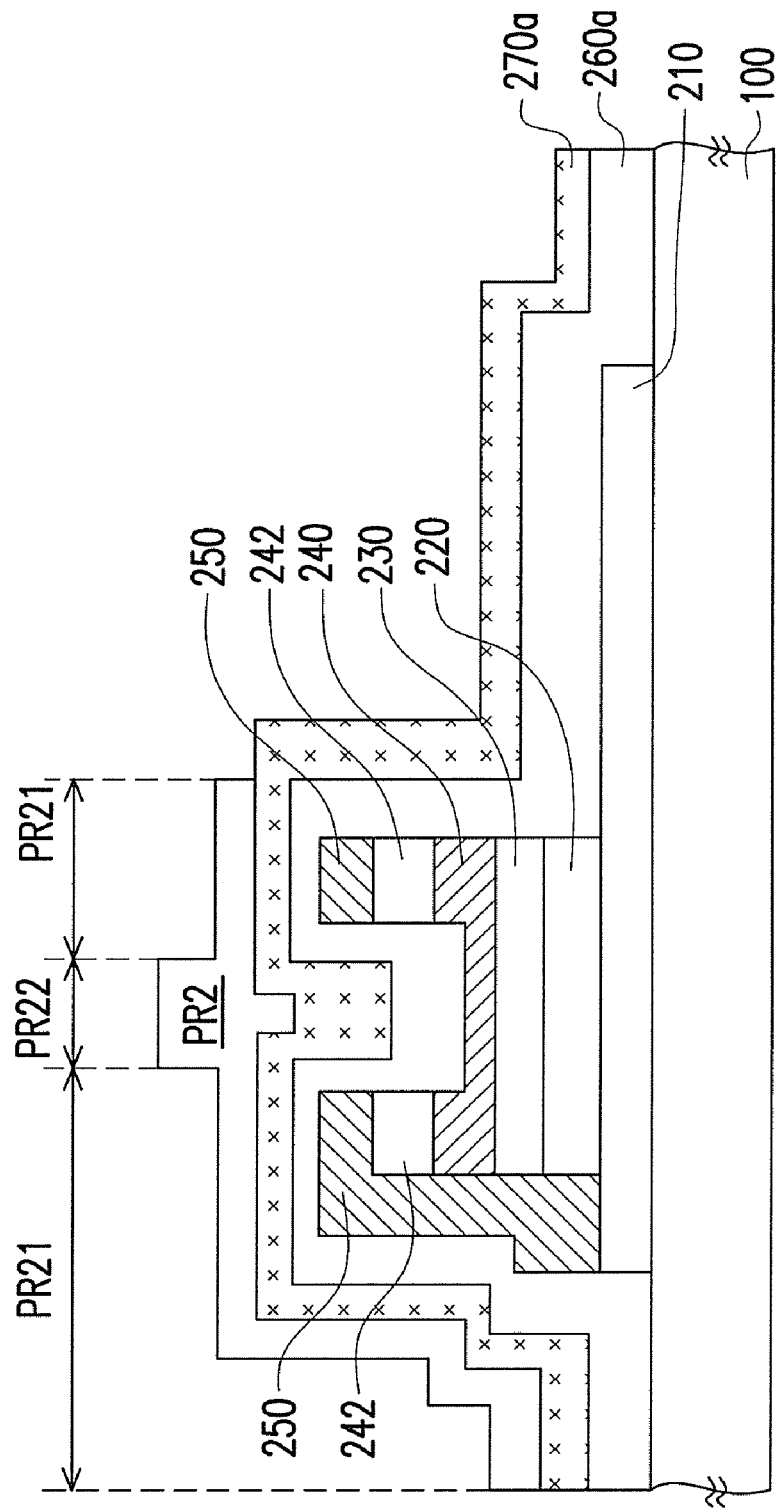

A method of forming the dielectric layer 260 and the gate 270 is described thereafter. Referring to FIG. 2G, a dielectric material layer 260a, a second conductive material layer 270a and a second photoresist-layer PR2 are sequentially formed on the substrate 100, wherein the dielectric material layer 260a covers the semiconductor pattern 240, the inter-layer dielectric pattern 230, the shielding pattern 220 and the pixel electrode 210.

In the present embodiment, the second photoresist-layer PR2 has a thinner portion PR21 and a thicker portion PR22, wherein the second photoresist-layer PR2 is, for example, a positive photoresist. Besides, a method of forming the second photoresist-layer PR2 is, for example, firstly coating a photosensitive material layer (not shown) on the second conductive material layer 270a by spin coating, slit/spin coating or spin-less coating. Then, after the photosensitive material layer is exposed by using the HTM (not shown) or the gray-level mask (not shown) with zones of different light penetration rates, processes such as development and hard bake are further performed. Wherein, the half-tone mask or the gray-level mask includes a transparent zone with a substantially 100% light penetration rate, a semi-transparent zone corresponding to a thinner portion PR21 and an opaque zone with a substantially 0% light penetration rate and corresponding to a thicker portion PR22.

Figure 2H:
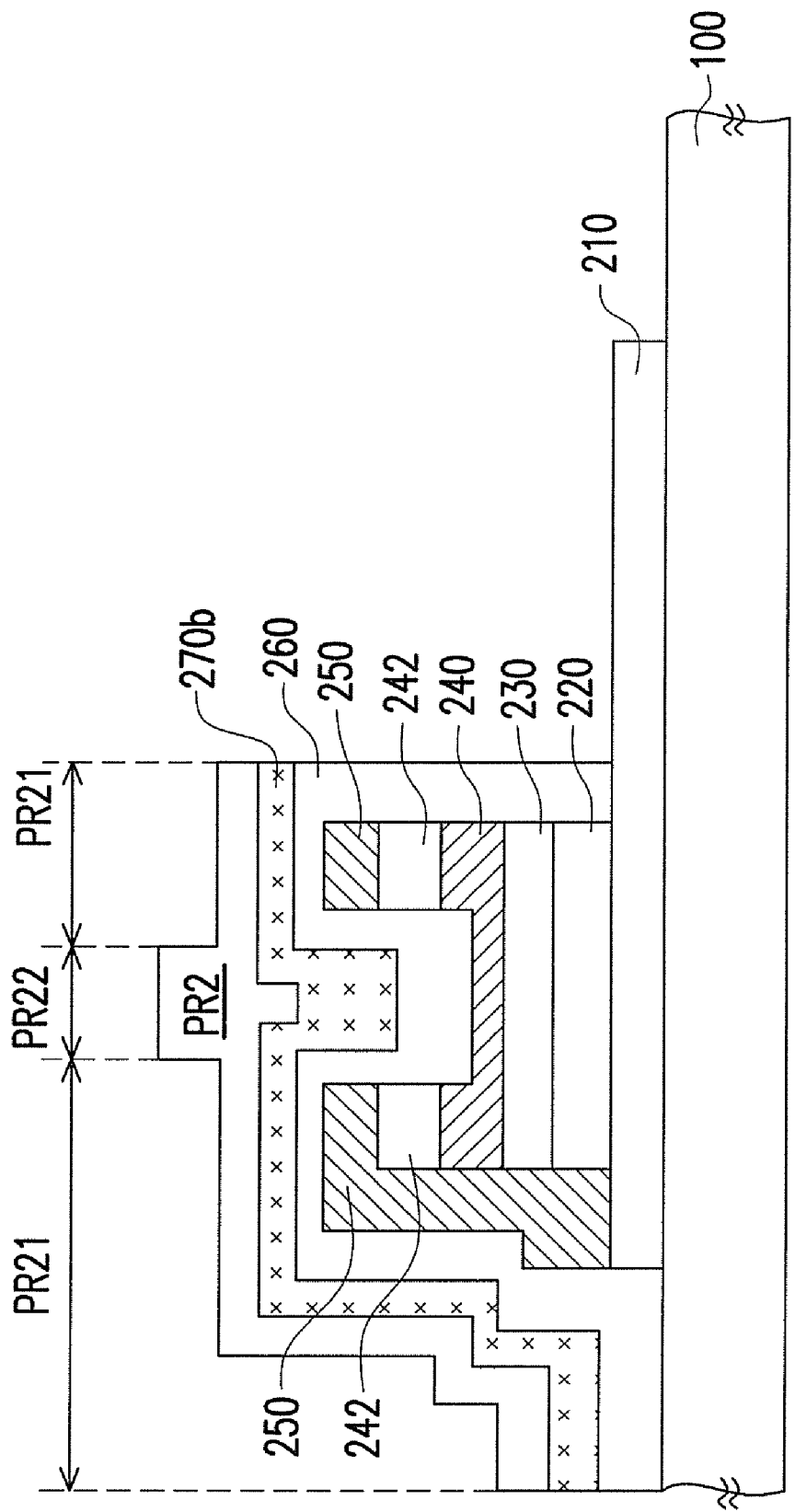

Moreover, the second conductive material layer 270a and the dielectric material layer 260a are patterned by using the second photoresist-layer PR2 as the mask to form a conductive material pattern 270b and the dielectric layer 260, and exposing a portion of the pixel electrode 210 as illustrated in FIG. 2H. It should be noted that, the above-described patterning of the dielectric material layer 260a is not a necessary step in the manufacturing process. That is to say that, in the present embodiment, the dielectric material layer 260a may also be not patterned to make the dielectric layer 260 completely covers the pixel electrode 210, and this means that the dielectric layer 260 does not expose the pixel electrode 210. In short, the pattern of the dielectric layer 260 should be determined upon actual products, and the present invention is not limited thereto.

Figure 2I:
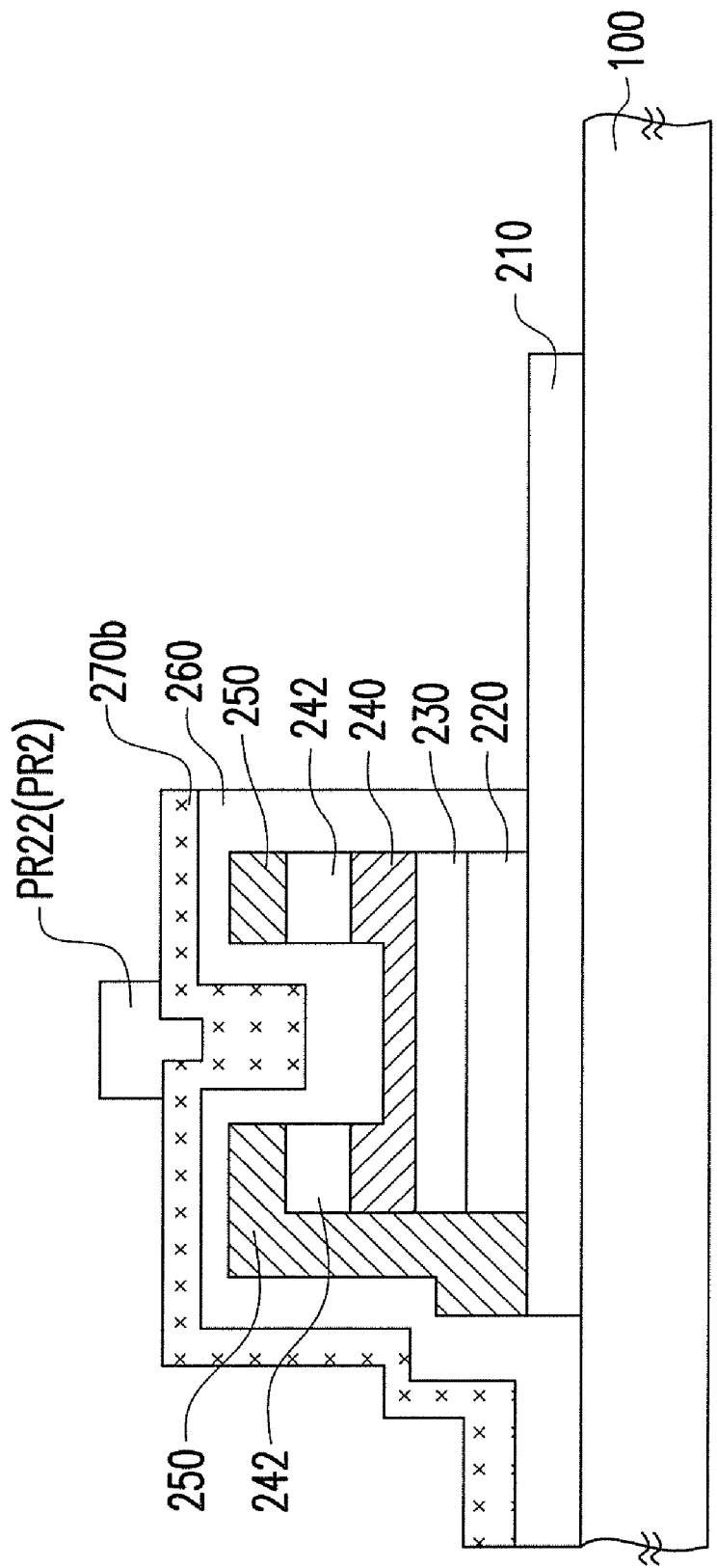

Next, a thickness of the second photoresist-layer PR2 is reduced until a thinner portion PR21 of the second photoresist-layer PR2 is removed but the thicker portion PR22 thereof is retained, as illustrated in FIG. 2I. In the present embodiment, a method of reducing the thickness of the second photoresist-layer PR2 is, for example, to perform the dry etching ashing process.

Afterwards, the exposed conductive material pattern 270b in FIG. 2I is removed by using the thicker portion PR22 of the second photoresist-layer PR2 to form the gate 270 illustrated in FIG. 1A and FIG. 1B. After this step of removing the second photoresist-layer PR2, it is the pattern as illustrated in FIG. 1A and FIG. 1B. However, if the dielectric layer 260 completely covers the pixel electrode 210, then the pattern formed after removing the second photoresist-layer PR2 is a pixel structure 3000 as illustrated in FIG. 3.

Figure 3:
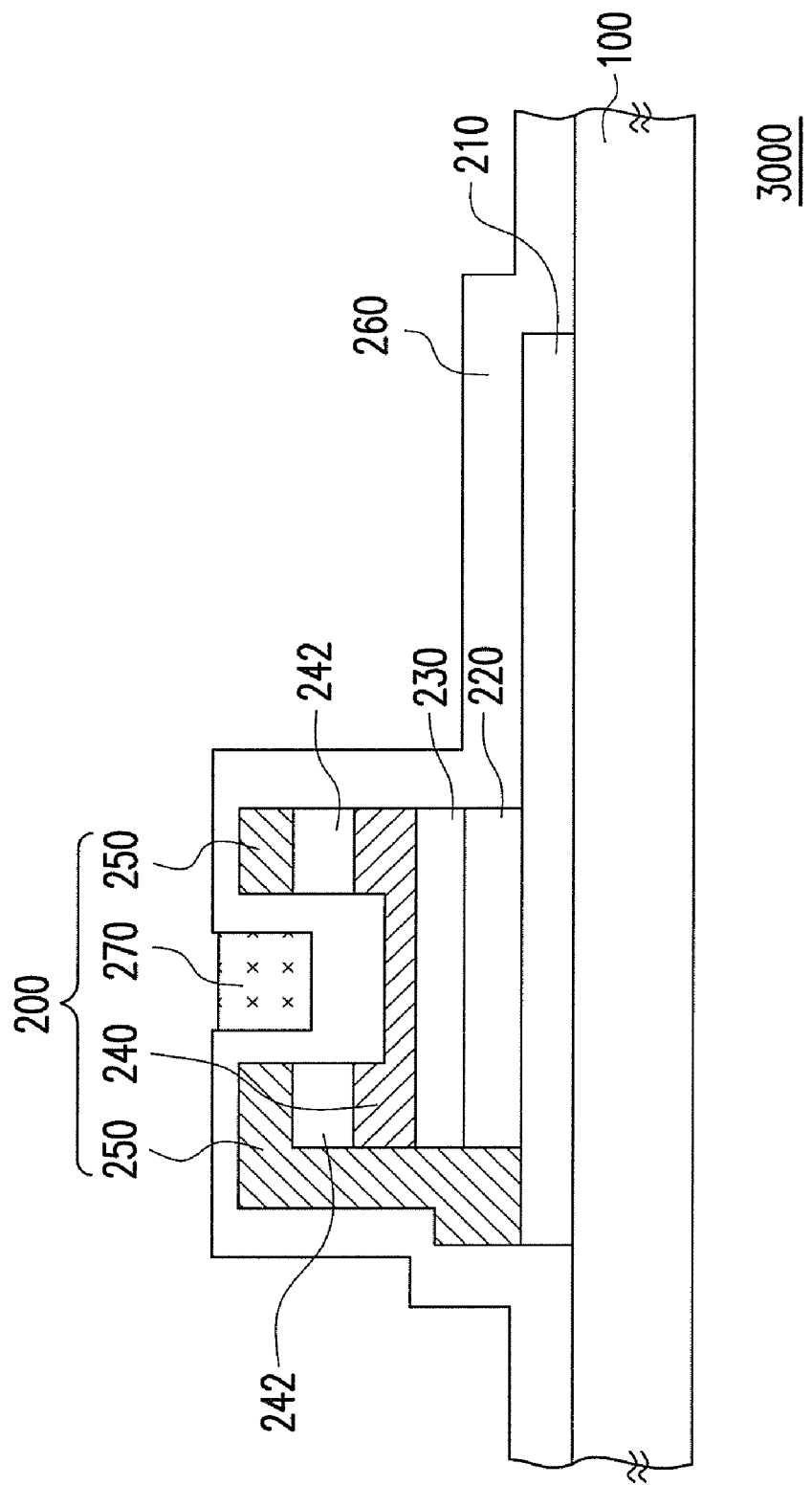
FIG. 3 is a partially cross-section schematic diagram illustrating a pixel structure according to another embodiment of the present invention.

Accordingly, in the present embodiment, the another one-mask process is used to form the dielectric layer 260 and the gate 270 in the pixel structure 1000 or the pixel structure 3000, wherein the dielectric layer 260 may expose a portion of the pixel electrode 210 (as illustrated by the pixel structure 1000 in FIG. 1A) or completely cover the pixel electrode 210 (as illustrated by the pixel structure 3000 in FIG. 3).

To be more specifically, in the present embodiment, a first mask process is first used to form the semiconductor pattern 240, the inter-layer pattern 230, the shielding pattern 220 and the pixel electrode 210. Then, a second mask process is used to form the source/drain 250, and finally a third mask process is used to form the dielectric layer 260 and the gate 270. That is, the present embodiment only use three-mask process to form the pixel structure 1000 or 3000 having top gate TFT 200. Thus, fabrication cost of masks is saved and the process is simplified.

Figure 4:
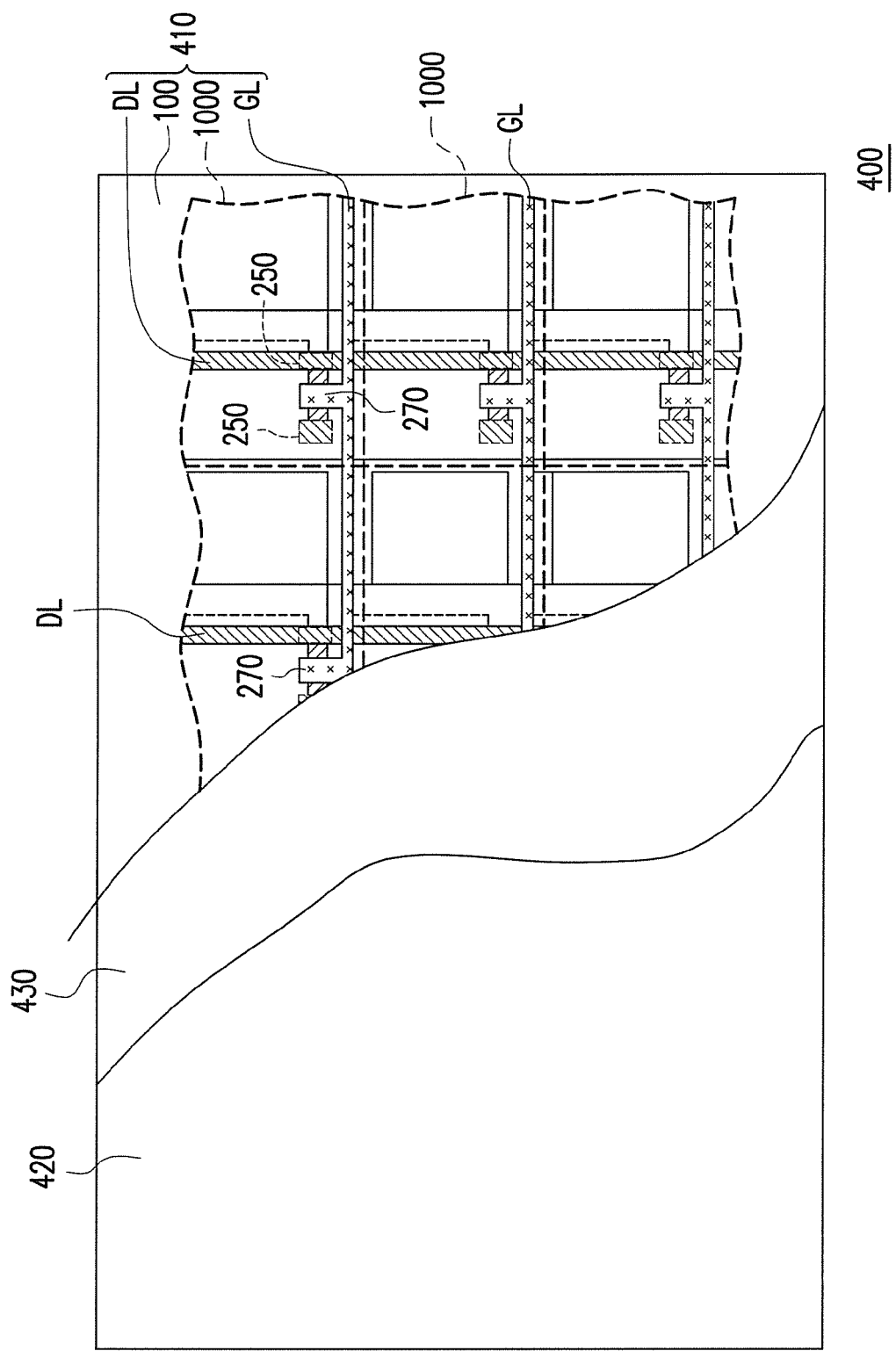
FIG. 4 is a partially top view schematic diagram illustrating a display panel according to an embodiment of the present invention.

Next, in the present embodiment, the above-described pixel structure 1000 and the pixel structure 3000 are further applied in the display panel. For example, referring to FIG. 4, wherein the pixel structure illustrated in FIG. 4 is the pixel structure 1000, and the display panel 400 of the present embodiment includes an active element substrate 410, an opposite substrate 420 and a display dielectric layer 430 disposed between the active element substrate 410 and the opposite substrate 420, wherein material of the display dielectric layer 430 may be liquid crystal, electro-luminescence materials or other suitable materials. The active element substrate 410 includes a substrate 100, a plurality of pixel structures 1000 arranged in an array disposed on the substrate 100, a plurality of scan lines GL which are parallel to each other and a plurality of data lines DL which are parallel to each other. Wherein, the data lines DL and the scan lines GL are interleaved, each of the scan lines GL is electrically connected to a corresponding gate 270, and each of the data lines DL is electrically connected to a corresponding source/drain 250. However, the pixel structure in the display panel 400 of the present embodiment may also be the pattern of the pixel structure 3000, and it is not described more therein.

It should be noted that, the display panel 400 of the present embodiment may be a transmissive display panel, a reflective display panel or a transflective display panel. Take the transmissive display panel or the transflective display panel for example, the display panel 400 may be further collaborated with a backlight module (not shown) to form a transmissive display apparatus or a transflective display apparatus. If the backlight module is disposed under the display panel 400, via disposition of the shielding pattern 220 in the pixel structure 1000 or the pixel structure 3000, light provided by a light source in the backlight module may be ensured not to radiate upon the semiconductor pattern 240 so as to prevent the photo-induced leakage current of the top gate TFT 200 in the pixel structure 1000 or the pixel structure 3000 due to light illumination.

In the present embodiment, the shielding pattern 220, the inter-layer dielectric pattern 230 or the semiconductor pattern 240 in the pixel structure 1000 or the pixel structure 3000 have an identical pattern, for example. However, in principle, a boundary of the semiconductor pattern 240 mainly does not exceed a boundary of the shielding pattern 220, so as to reduce a possibility of photo-induced leakage current due to the light illumination and further improve electrical characteristics of the top gate TFT 200.

In summary, the manufacturing method of the pixel structure provided by the present invention uses three-mask process to form the pixel structure of the present invention. By doing so, not only fabrication cost of the masks is saved but also the complexity of the manufacturing process is simplified. In addition, disposition of the shielding pattern in the display panel and the pixel structure thereof in the present invention may resolve a problem of the photo-induced leakage current of the top gate TFTs due to the light illumination. Therefore, the top gate TFTs thereof have good electrical characteristics, thereby making the display panel have good display quality.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing method of a pixel structure, comprising:
    forming an electrode material layer, a shielding material layer, an inter-layer dielectric material layer, a semiconductor material layer and a first photoresist-layer sequentially on a substrate;
    patterning the semiconductor material layer, the inter-layer dielectric material layer, the shielding material layer and the electrode material layer by using the first photoresist-layer as a mask to form a semiconductor pattern, an inter-layer dielectric pattern, a shielding pattern and a pixel electrode;
    forming a source/drain on the pixel electrode, wherein the source/drain is electrically connected to the pixel electrode and covers a portion of the semiconductor pattern, and a channel is another portion of the semiconductor pattern uncovered by the source/drain; and
    forming a dielectric layer and a gate on the substrate, wherein the dielectric layer covers the source/drain, the semiconductor pattern, the inter-layer dielectric pattern, the shielding pattern and the pixel electrode, and the gate is disposed on the dielectric layer above the channel.

2. The manufacturing method of the pixel structure as claimed in claim 1, wherein the first photoresist-layer has a thinner portion and a thicker portion and the method of forming the semiconductor pattern, the inter-layer dielectric pattern, the shielding pattern and the pixel electrode comprises:
    patterning the semiconductor material layer, the inter-layer dielectric material layer, the shielding material layer and the electrode material layer by using the first photoresist-layer as the mask to form a semiconductor material pattern, an inter-layer dielectric material pattern, a shielding material pattern and a pixel electrode;
    removing the thinner portion and retaining the thicker portion;
    removing the exposed semiconductor material pattern, the exposed inter-layer dielectric material pattern and the exposed shielding material pattern by using the thicker portion of the first photoresist-layer to form the semiconductor pattern, the inter-layer dielectric pattern and the shielding pattern; and
    removing the first photoresist-layer.

3. The manufacturing method of the pixel structure as claimed in claim 2, wherein the method of forming the first photoresist-layer comprises using a half-tone mask or a gray-level mask.

4. The manufacturing method of the pixel structure as claimed in claim 1, further comprising:
   forming an ohmic contact material layer on the semiconductor material layer;
   patterning the ohmic contact material layer by using the first photoresist-layer as the mask to form an ohmic contact material pattern; and
   removing the exposed ohmic contact material pattern by using the source/drain as a mask to form an ohmic contact pattern between the semiconductor pattern and the source/drain.

5. The manufacturing method of the pixel structure as claimed in claim 1, wherein the dielectric layer completely covers the pixel electrode.

6. The manufacturing method of the pixel structure as claimed in claim 1, wherein the method of forming the dielectric layer and the gate comprises:
   forming a dielectric material layer, a conductive material layer and a second photoresist-layer sequentially on the substrate, wherein the second photoresist-layer has a thinner portion and a thicker portion, and the dielectric material layer covers the semiconductor pattern, the inter-layer dielectric pattern, the shielding pattern and the pixel electrode;
   patterning the conductive material layer and the dielectric material layer by using the second photoresist-layer as a mask to form a conductive material pattern and the dielectric layer, and exposing a portion of the pixel electrode;
   removing the thinner portion and retaining the thicker portion;
   removing the exposed conductive material pattern by using the thicker portion of the second photoresist-layer as the mask to form the gate; and
   removing the second photoresist-layer.

7. The manufacturing method of the pixel structure as claimed in claim 6, wherein the method of forming the second photoresist-layer comprises using a half-tone mask or a gray-level mask.

* * * * *